(12) United States Patent
Mizuno et al.

(10) Patent No.: US 9,124,827 B2
(45) Date of Patent: Sep. 1, 2015

(54) IMAGE-CAPTURING APPARATUS HAVING A CONTROL UNIT TO VARY A VARIABLE SENSITIVITY VOLTAGE BASED ON AN OUTPUT LEVEL OF IMAGE-CAPTURED DATA

(71) Applicant: Panasonic Corporation, Osaka (JP)

(72) Inventors: Katsunori Mizuno, Hyogo (JP); Yoshiyuki Matsunaga, Kyoto (JP); Takahiro Yamamoto, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 268 days.

(21) Appl. No.: 13/920,156

(22) Filed: Jun. 18, 2013

(65) Prior Publication Data

US 2013/0277536 A1 Oct. 24, 2013

Related U.S. Application Data

(63) Continuation of application No. PCT/JP2011/006478, filed on Nov. 21, 2011.

(30) Foreign Application Priority Data

Dec. 22, 2010 (JP) ................................ 2010-286654

(51) Int. Cl.
*H01L 27/00* (2006.01)
*H04N 5/353* (2011.01)
(Continued)

(52) U.S. Cl.
CPC .......... *H04N 5/3535* (2013.01); *H01L 27/1461* (2013.01); *H04N 5/3532* (2013.01); *H04N 5/3559* (2013.01); *H04N 5/3745* (2013.01)

(58) Field of Classification Search
CPC .... H01N 3/155; H01N 5/3535; H01N 5/3532; H01L 31/022466
USPC ........... 250/208.1, 214 R, 239; 348/281–311; 257/290–292, 440
See application file for complete search history.

(56) References Cited

U.S. PATENT DOCUMENTS 4,583,002 A * 4/1986 Kondo et al. ............... 250/208.1
5,157,502 A 10/1992 Nakajima et al.
(Continued)

FOREIGN PATENT DOCUMENTS

JP 1-64266 4/1989
JP 1-112877 5/1989
(Continued)

OTHER PUBLICATIONS

International Search Report of PCT Application No. PCT/JP2011/006478 dated Dec. 27, 2011.

*Primary Examiner* — Que T Le
(74) *Attorney, Agent, or Firm* — McDermott Will & Emery LLP

(57) ABSTRACT

An image-capturing apparatus including a solid-state imaging device including unit-cells arranged in a matrix, in which each of the unit-cells includes a photoelectric conversion unit including: a photoelectric conversion film formed above a semiconductor substrate; a pixel electrode formed on a surface of the photoelectric conversion film, the surface facing the semiconductor substrate; and a transparent electrode formed on a surface of the photoelectric conversion film, the surface being opposite the surface on which the pixel electrode is formed, and the image-capturing apparatus further includes: a voltage applying unit which applies, between the pixel electrode and the transparent electrode, a variable sensitivity voltage for controlling sensitivity of the solid-state imaging device; a level detecting unit which detects an output level of image-captured image data from the solid-state imaging device; and a controlling unit which varies the variable sensitivity voltage based on the output level detected by the level detecting unit.

6 Claims, 15 Drawing Sheets

(51) Int. Cl.
*H01L 27/146* (2006.01)
*H04N 5/355* (2011.01)
*H04N 5/3745* (2011.01)

(56) References Cited

U.S. PATENT DOCUMENTS

| | | |
|---|---|---|
| 5,585,848 A | 12/1996 | Hieda et al. |
| 5,606,366 A | 2/1997 | Hieda et al. |
| 5,675,381 A | 10/1997 | Hieda et al. |
| 6,730,914 B2 | 5/2004 | Chao et al. |
| 7,663,682 B2 | 2/2010 | Misawa |
| 7,667,755 B2 | 2/2010 | Misawa |
| 2007/0076093 A1 | 4/2007 | Misawa |
| 2007/0076108 A1 | 4/2007 | Misawa |

FOREIGN PATENT DOCUMENTS

| | | |
|---|---|---|
| JP | 3-163967 | 7/1991 |
| JP | 4-119776 | 4/1992 |
| JP | 4-167779 | 6/1992 |
| JP | 5-167056 | 7/1993 |
| JP | 2007-104113 | 4/2007 |
| JP | 2007-104114 | 4/2007 |
| JP | 2010-278086 | 12/2010 |

\* cited by examiner

IMAGE-CAPTURING APPARATUS HAVING A CONTROL UNIT TO VARY A VARIABLE SENSITIVITY VOLTAGE BASED ON AN OUTPUT LEVEL OF IMAGE-CAPTURED DATA

CROSS REFERENCE TO RELATED APPLICATION(S)

This is a continuation application of PCT Patent Application No. PCT/JP2011/006478 filed on Nov. 21, 2011, designating the United States of America, which is based on and claims priority of Japanese Patent Application No. 2010-286654 filed on Dec. 22, 2010. The entire disclosures of the above-identified applications, including the specifications, drawings and claims are incorporated herein by reference in their entirety.

FIELD

The present disclosure relates generally to image-capturing apparatuses, and particularly to an image-capturing apparatus which is capable of performing exposure compensation while suppressing deterioration (discontinuity) in resolution of moving images between frames.

BACKGROUND

Conventionally, methods using so-called an electronic shutter function in which an electric charge accumulation time period in a solid-state imaging device is controlled by discharging electric charges accumulated in the solid-state imaging device through a photoelectric conversion (for example, see Patent Literature (PTL) 1 to 3). Hereinafter, a conventional image-capturing apparatus having the electronic shutter function will be described.

FIG. 14 is an exemplary function block diagram showing a configuration of a camcorder which is the image-capturing apparatus.

The camcorder includes: a lens 302 and an aperture/mechanical shutter 303 positioned at the light receiving side of a solid-state imaging device 301; an analog signal processing unit 304 which receives image-captured data generated in the solid-state imaging device 301 which has received light, and performs correlated double sampling and A/D conversion that is conversion from an analog signal to a digital signal; a digital signal processing unit 305 which receives the analog processed digital image-captured data (image signal) and generates image-captured image data through signal processing such as RGB/YC conversion; a graphic I/F 306 for displaying the image-captured image data digitally processed in the digital signal processing unit 305 on a monitor; a display 307 which displays the image-captured image data; a compression signal processing unit 308 which compresses the digitally processed image-captured image data to image-captured image data in JPEG format and the like; a recording medium 309 on which the compressed image-captured image data is recorded; and a system controlling unit 310 which outputs/inputs output data from the analog signal processing unit 304 and the digital signal processing unit 305, a control signal, and others.

The system controlling unit 310 controls, according to the image-captured image data including information about an amount of exposure and others provided to the system controlling unit 310, an electronic shutter driving unit (TG) 311 for controlling an operation of an electronic shutter in the solid-state imaging device 301, an exposure controlling driver 312 for controlling the aperture/mechanical shutter 303, and a lens driver 313 for controlling the lens.

FIG. 15 is a flowchart showing a procedure of representative exposure compensation used in the camcorder configured as above.

The solid-state imaging device 301 receives incident light to generate an image signal, and the generated image signal is processed in the analog signal processing unit 304 and the digital signal processing unit 305, to be image-captured image data. The image-captured image data is provided to the system controlling unit 310, rough exposure compensation is performed by controlling the aperture/mechanical shutter 303 according to the provided image-captured image data (Step S11), and then exposure compensation is performed by adjusting electronic shutter speed (an electric charge accumulation time period) of the electronic shutter driving unit 311 (Step S12).

Here, there may be a case where the aperture/mechanical shutter 303 is not installed in the camcorder to avoid an increase in cost, so that the exposure compensation in Step S11 shown in FIG. 15 is not performed but exposure compensation is performed only with an adjustment of the electronic shutter speed in Step S12.

CITATION LIST

Patent Literature

[PTL 1] Japanese Unexamined Patent Application Publication No. 1-112877
[PTL 2] Japanese Unexamined Patent Application Publication No. 4-167779
[PTL 3] Japanese Unexamined Patent Application Publication No. 5-167056

SUMMARY

Technical Problem

However, the method using the electronic shutter function for the exposure compensation in PTL 1 to 3 has a problem in that resolution of moving images varies on a frame basis, resulting in a failure in image quality in which the movement of captured images (resolution of moving images) becomes unnatural. Moreover, in principle, an unnecessary electric charge accumulation time period occurs during which electric charges that are not outputted as video are accumulated, so that a problem of a failure in image quality arises that, when a subject is moving at the time of video capturing, the captured images of the subject are discontinuously outputted as video.

Although an effect to suppress variations in the resolution of moving images is expected by discretely generating reset control signals in PTL 2, there is a problem of a cost increase due to increased size of a circuit, difficulty in size reduction, and others because a discrete pulse generating circuit and peripheral computing circuits are needed besides the solid-state imaging device.

One non-limiting and exemplary embodiment provides an image-capturing apparatus which is capable of performing exposure compensation while suppressing a failure in image quality.

Solution to Problem

An image-capturing apparatus according to an aspect of the present disclosure includes a solid-state imaging device including a plurality of unit-cells arranged in a matrix, in which each of the unit-cells includes a photoelectric conversion unit, the photoelectric conversion unit includes: a photoelectric conversion film formed above a semiconductor substrate; a pixel electrode formed on a surface of the photoelectric conversion film, the surface facing the semiconductor substrate; and a transparent electrode formed on a surface of the photoelectric conversion film, the surface being opposite the surface on which the pixel electrode is formed, and the image-capturing apparatus further includes: a voltage applying unit configured to apply, between the pixel electrode and the transparent electrode, a variable sensitivity voltage for controlling sensitivity of the solid-state imaging device; a level detecting unit configured to detect an output level of image-captured image data from the solid-state imaging device; and a controlling unit configured to vary the variable sensitivity voltage based on the output level detected by the level detecting unit.

Here, it may be that: the solid-state imaging device further includes vertical signal lines each of which is provided corresponding to a column of the unit-cells and transmits signal voltages of the unit-cells in the corresponding column; each of the unit-cells further includes an amplifier transistor, a selection transistor, and a reset transistor; the amplifier transistor is connected between a corresponding one of the vertical signal lines and a power line, and has a gate connected to the pixel electrode; the reset transistor is connected to the pixel electrode, and resets electrical potential of the pixel electrode; and the selection transistor is connected between the amplifier transistor and the vertical signal line, or between the amplifier transistor and the power line.

According to this aspect, a stack-type solid-state imaging device is used, and a voltage between the pixel electrode and the transparent electrode which determines the sensitivity of the solid-state imaging device is variable. The voltage is referred to as a variable sensitivity voltage. Accordingly, exposure compensation can be performed with the variable sensitivity voltage being varied without varying an electric charge accumulation time period, that is, without using an electronic shutter function, thereby enabling exposure compensation while suppressing a failure in image quality.

Furthermore, it may be that the unit-cell further includes a constant bias transistor, and the constant bias transistor is connected to the pixel electrode and the gate of the amplifier transistor, and has a gate connected to a constant bias power source.

According to this aspect, a range of variability according to the variable sensitivity voltage can be widened, thereby significantly suppressing variation in frequency of moving images.

Furthermore, the controlling unit may further be configured to vary a voltage of the constant bias power source based on the output level detected by the level detecting unit.

According to this aspect, the range of variability according to the variable sensitivity voltage can be further widened, thereby further significantly suppressing variation in frequency of moving images.

Furthermore, the image-capturing apparatus may further include an electronic shutter controlling unit configured to control an operation of an electronic shutter in the solid-state imaging device, in which the controlling unit may further be configured to: vary an accumulation time period during which electric charges are accumulated, by varying timing of the electronic shutter based on the output level detected by the level detecting unit, the electric charges generated in the photoelectric conversion film in response to light incident on the solid-state imaging device; and determine whether to operate under a first driving mode or a second driving mode based on the output level detected by the level detecting unit, the first driving mode being a mode in which the variable sensitivity voltage is varied while the accumulation time period is fixed, the second driving mode being a mode in which the accumulation time period and the variable sensitivity voltage are varied. Furthermore, the image-capturing apparatus may further include an electronic shutter controlling unit configured to control an operation of an electronic shutter in the solid-state imaging device, in which the controlling unit may further be configured to vary an accumulation time period during which electric charges are accumulated, by varying timing of the electronic shutter based on the output level detected by the level detecting unit, the electric charges generated in the photoelectric conversion film in response to light incident on the solid-state imaging device.

According to this aspect, the variable sensitivity voltage and the electric charge accumulation time period can be adjusted according to the brightness of a subject to perform the exposure compensation, thereby enabling exposure compensation with great flexibility.

Advantageous Effects

According to the present disclosure, an image-capturing apparatus is implemented which is capable of performing exposure compensation according to a condition of a subject while suppressing a failure in image quality.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DESCRIPTION OF EMBODIMENTS

Figure 1:
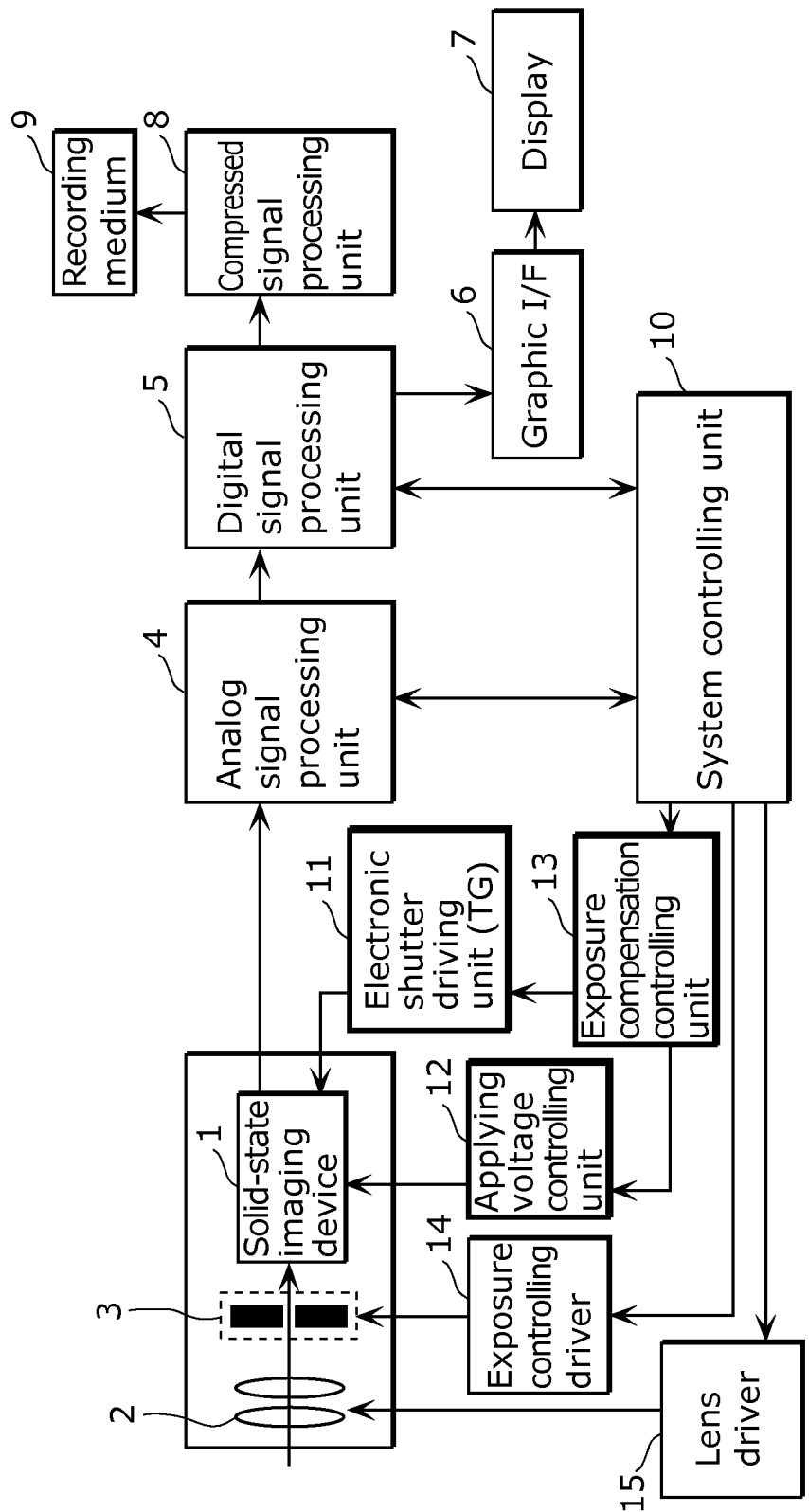
FIG. 1 is a function block diagram showing a configuration of an image-capturing apparatus according to Embodiment 1 of the present disclosure.

Hereinafter, an image-capturing apparatus according to embodiments of the present disclosure is described with reference to the accompanying drawings.

It is to be noted that the same reference numerals are assigned to elements having substantially the same configuration, operation, and effect. Moreover, all numerical values described below are mere examples for specific description, and therefore do not limit the scope of the present disclosure. Furthermore, connections between structural elements are mere examples for specific description, and therefore do not limit the connections which enable functions in the present disclosure. Furthermore, having the same structure and function in most cases, the source electrode and the drain electrode of a FET are often not explicitly distinguished from each other. However, for simplicity in the description below, an electrode which receives a signal is referred to as a source electrode and an electrode which outputs a signal is referred to as a drain electrode.

Embodiment 1

FIG. 1 is a function block diagram showing a configuration of an image-capturing apparatus (camcorder) according to Embodiment 1 of the present disclosure.

The image-capturing apparatus according to this embodiment is a camera which captures a video image and a still image, and includes: a lens 2 and an aperture/mechanical shutter 3 positioned at the light receiving side of a solid-state imaging device 1; an analog signal processing unit 4 which receives image-captured data generated in the solid-state imaging device 1 which has received light, and performs correlated double sampling and A/D conversion that is conversion from an analog signal to a digital signal; a digital signal processing unit 5 which receives the analog processed digital image-captured data (image signal) and generates image-captured image data through signal processing such as RGB/YC conversion; a graphic I/F 6 for displaying the image-captured image data digitally processed in the digital signal processing unit 5 on a monitor; a display 7 which displays the image-captured image data; a compression signal processing unit 8 which compresses the digitally processed image-captured image data in a predetermined compression format such as JPEG format; and a recording medium 9 on which the compressed image-captured image data is recorded.

The solid-state imaging device 1 is so-called a sensitivity-variable solid-state imaging device the light sensitivity of which is variable and is, for example, a stack-type solid-state imaging device using a photoelectric conversion film (for example, an amorphous silicon film) which performs photoelectric conversion according to incident light.

The image-capturing apparatus according to this embodiment includes a system controlling unit (level detecting unit) 10 which detects output data from the analog signal processing unit 4 and the digital signal processing unit 5, that is, an output level of image-captured image data provided from the solid-state imaging device 1, and generates a control signal.

The image-capturing apparatus according to this embodiment includes: an electronic shutter driving unit (electronic shutter controlling unit) 11 for controlling and driving an operation of an electronic shutter in the solid-state imaging device 1; an applying voltage controlling unit (voltage applying unit) 12 which applies, to the solid-state imaging device 1, a variable sensitivity voltage that is used for controlling the sensitivity of the solid-state imaging device 1; an exposure compensation controlling unit (controlling unit) 13 for controlling operations of the electronic shutter driving unit 11 and the applying voltage controlling unit 12 in a coordinated manner according to output data from the system controlling unit 10; a lens driver 15 for receiving an image signal of RGB from the system controlling unit 10 and performing automatic focusing (AF); and an exposure controlling driver 14 for controlling the aperture/mechanical shutter 3.

The system controlling unit 10 controls the exposure compensation controlling unit 13, the lens driver 15, and the exposure controlling driver 14 according to the image-captured image data including information about the amount of exposure received from the analog signal processing unit 4 and the digital signal processing unit 5.

The exposure compensation controlling unit 13 varies the variable sensitivity voltage according to the output level detected in the system controlling unit 10. Moreover, by varying timing of the electronic shutter based on the output level detected in the system controlling unit 10, the exposure compensation controlling unit 13 varies an accumulation time period during which electric charges are accumulated. In this regard, the electric charges are generated in the photoelectric conversion film in the solid-state imaging device 1 in response to light incident on the solid-state imaging device 1. The exposure compensation controlling unit 13 determines, based on the output level detected in the system controlling unit 10, whether to operate under a first driving mode in which the variable sensitivity voltage is varied while the accumulation time period is fixed or a second driving mode in which both the accumulation time period and the variable sensitivity voltage are varied.

It is to be noted that although the image-capturing apparatus according to this embodiment includes, for example, the analog signal processing unit 4 for analog processing this is not needed in the case where a digital signal is provided from the solid-state imaging device 1.

Figure 14:
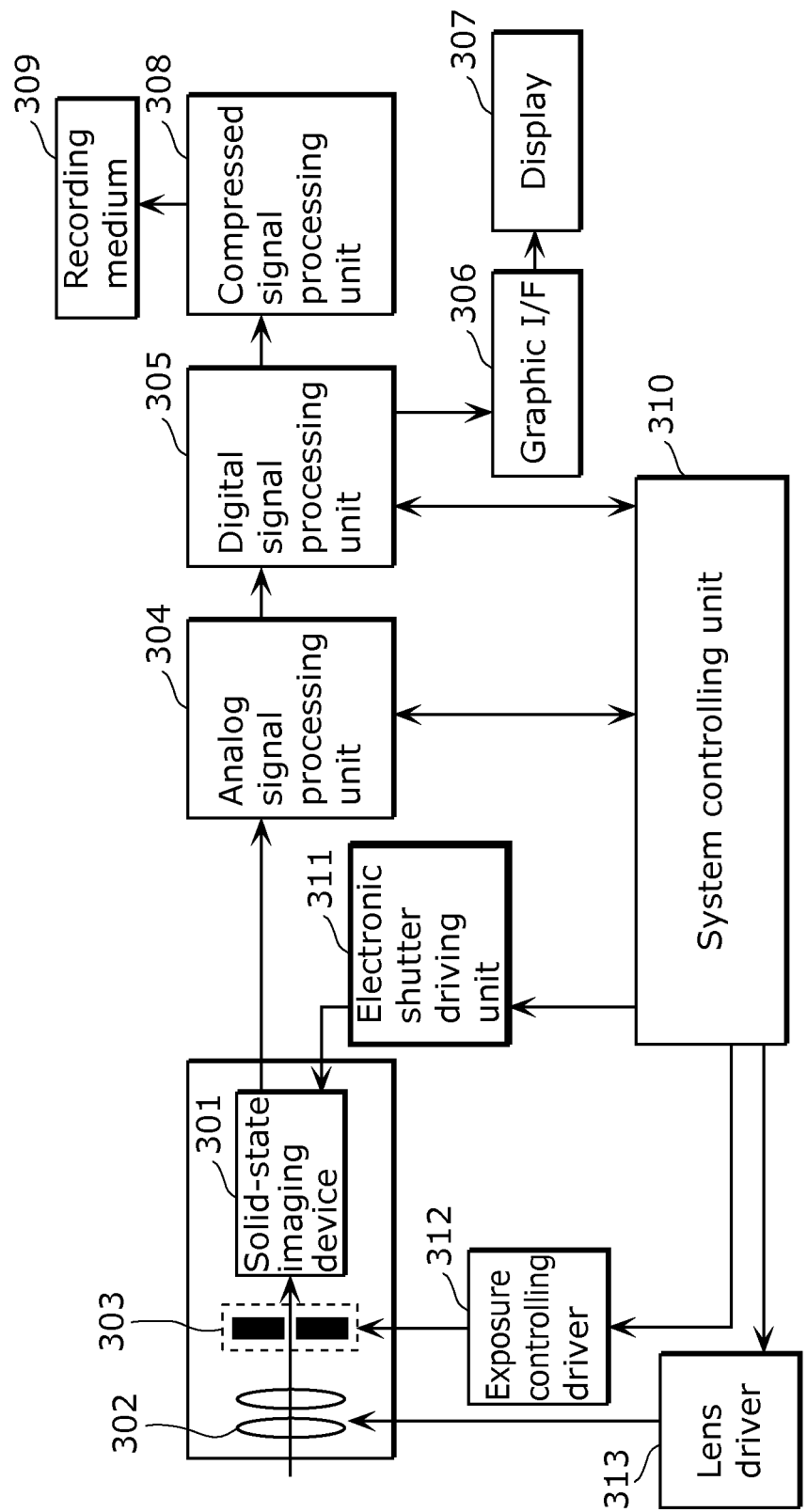
FIG. 14 is a function block diagram showing an example of a configuration of a conventional camcorder.
Figure 15:
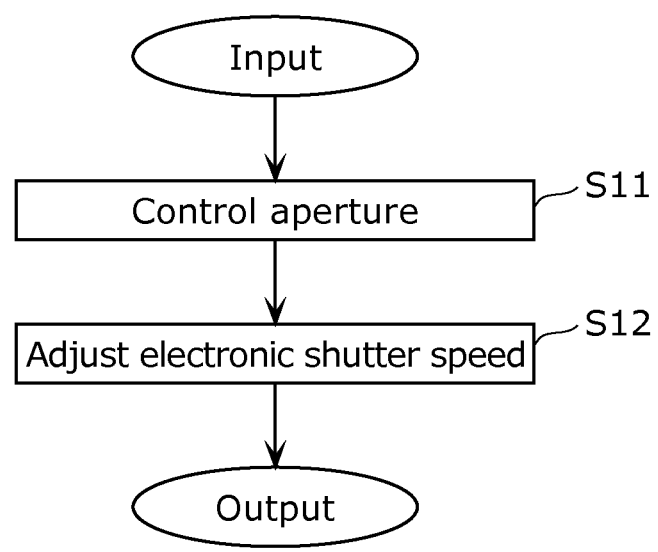
FIG. 15 is a flowchart showing a procedure of exposure compensation performed by a conventional electronic shutter function.

The image-capturing apparatus according to this embodiment is significantly different from the image-capturing apparatus in FIG. 14 in that the image-capturing apparatus according to this embodiment includes the sensitivity-variable solid-state imaging device 1, the applying voltage controlling unit 12 which controls the solid-state imaging device 1, and the exposure compensation controlling unit 13 which performs exposure compensation by controlling the electronic shutter driving unit 11 and the applying voltage controlling unit 12 in a coordinated manner.

Figure 2:
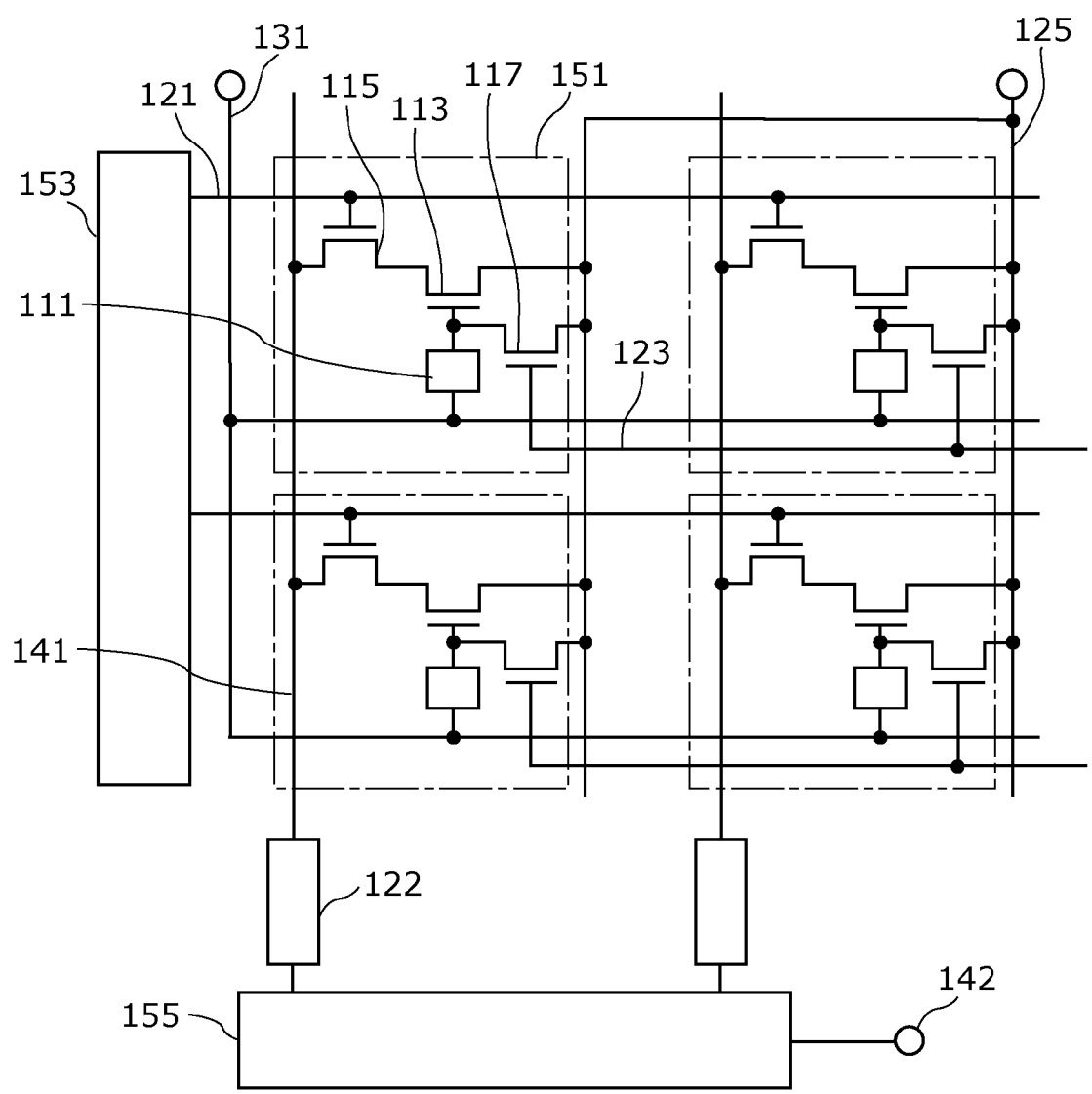
FIG. 2 is a circuit diagram showing a configuration of a solid-state imaging device according to Embodiment 1 of the present disclosure.
Figure 3:
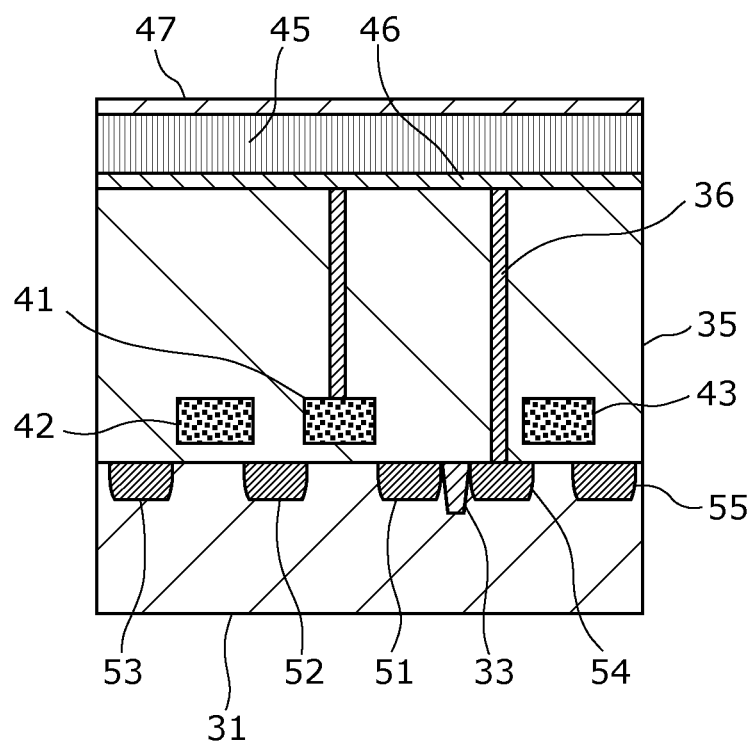
FIG. 3 is a sectional view schematically showing a structure of a unit-cell in the solid-state imaging device according to Embodiment 1 of the present disclosure.

The following describes details of the solid-state imaging device 1 according to this embodiment with reference to FIGS. 2 and 3.

FIG. 2 is a circuit diagram showing a configuration of the solid-state imaging device 1 according to this embodiment.

As shown in FIG. 2, the solid-state imaging device 1 includes: plural unit-cells 151 arranged in a matrix, a vertical scanning unit 153 which supplies various timing signals to the unit-cells 151, address controlling lines 121, column signal processing units 122, reset controlling lines 123, a power line 125, a photoelectric conversion unit controlling line 131, vertical signal lines 141 each of which is provided for each of columns of the unit-cells 151 and transmits signal voltages of the unit-cells 151 in a corresponding column, an output terminal 142, and a horizontal signal read unit (horizontal scanning unit) 155 which sequentially reads out signals from the unit-cells 151 to the output terminal 142.

It is to be noted that although FIG. 2 shows "two rows by two columns" of the unit-cells 151, the number of rows and columns may be arbitrary set.

Each of the unit-cells 151 includes: a photoelectric conversion unit 111; an amplifier transistor 113 connected between the vertical signal line 141 and the power line 125, and having a gate connected to the photoelectric conversion unit 111; a reset transistor 117 having a drain connected to the photoelectric conversion unit 111; and a selection transistor 115 connected in series to the amplifier transistor 113. The output of the unit-cell 151 is connected to the vertical signal line 141.

The photoelectric conversion unit 111 is connected between the gate of the amplifier transistor 113 and the drain of the reset transistor 117, and the photoelectric conversion unit controlling line 131. The photoelectric conversion unit 111 performs photoelectric conversion on the incident light to generate and accumulate signal electric charges according to the amount of the incident light.

The gate of the selection transistor 115 is connected to the vertical scanning unit 153 via the address controlling line 121. It is to be noted that although being connected between the amplifier transistor 113 and the vertical signal line 141, the selection transistor 115 may be connected between the amplifier transistor 113 and the power line 125.

The gate of the reset transistor 117 is connected to the vertical scanning unit 153 via the reset controlling line 123. The address controlling line 121 and the reset controlling line 123 are provided for each row. The photoelectric conversion unit controlling line 131 is shared by all the unit-cells 151. The vertical signal line 141 is connected to the horizontal signal read unit 155 via the column signal processing unit 122.

The column signal processing unit 122 performs, for example, A/D conversion and noise suppressing signal processing that is represented by correlated double sampling.

FIG. 3 is a sectional view showing a configuration of the unit-cell 151 in the solid-state imaging device 1 according to this embodiment.

As shown in FIG. 3, the unit-cell 151 includes the amplifier transistor 113, the selection transistor 115, and the reset transistor 117 formed on a semiconductor substrate 31 made of silicon.

The amplifier transistor 113 includes a gate electrode 41, a diffusion layer 51 which is the drain, and a diffusion layer 52 which is the source, and causes the vertical signal line 141 to read out a signal according to the light electric charges generated in response to light incident on the photoelectric conversion film 45.

The selection transistor 115 includes a gate electrode 42, a diffusion layer 52 which is the drain, and a diffusion layer 53 which is the source. The diffusion layer 52 is commonly used as the source of the amplifier transistor 113 and the drain of the selection transistor 115.

The reset transistor 117 includes a gate electrode 43, a diffusion layer 54 which is the drain, and a diffusion layer 55 which is the source. The diffusion layer 51 and the diffusion layer 54 are isolated by an isolation region 33. The reset transistor 117 resets (initializes) electrical potential of the gate of the amplifier transistor 113, that is, a unit-cell electrode (pixel electrode) 46.

On the semiconductor substrate 31, an insulating film 35 is formed to cover the transistors in the unit-cell 151. On the insulating film 35, the photoelectric conversion unit 111 is formed.

The photoelectric conversion unit 111 is formed above the semiconductor substrate 31, and includes: the photoelectric conversion film 45 which is positioned between the unit-cell electrode 46 and an opposing transparent electrode 47 and made of amorphous silicon and the like; the unit-cell electrode 46 formed on the lower surface (a surface facing the semiconductor substrate 31) of the photoelectric conversion film 45; and the transparent electrode 47 formed on the upper surface (a surface opposite the surface on which the unit-cell electrode 46 is formed) of the photoelectric conversion film 45.

The unit-cell electrode 46 is connected to the gate electrode 41 of the amplifier transistor 113 via a contact 36 and to the diffusion layer 54 which is the source of the reset transistor 117 via a contact 36. The diffusion layer 54 connected to the unit-cell electrode 46 functions as an accumulation diode.

Light from a subject incident on the solid-state imaging device 1 configured as above is absorbed by the photoelectric conversion film 45, and then electron-hole pairs (light electric charges) are generated according to the amount of the absorbed light. When a positive voltage is applied to the transparent electrode 47, electrons among the generated electron-hole pairs are transferred to the transparent electrode 47 and flow into a power source (not shown) connected with the transparent electrode 47. On the other hand, holes are transferred to and accumulated in the diffusion layer 54.

It is to be noted that although the positive voltage, for example, is applied to the transparent electrode 47 and the holes are used as carriers in the solid-state imaging device 1 according to this embodiment, a negative voltage may be applied to the transparent electrode 47 and the electrons may be used as the carriers.

Here, an electron-hole pair generated in the photoelectric conversion film 45 in response to the incident light may be recombined in the photoelectric conversion film 45. Therefore, the solid-state imaging device 1 according to this embodiment includes a line (photoelectric conversion unit controlling line 131) for applying a desired control voltage (variable sensitivity voltage) between the unit-cell electrode 46 and the transparent electrode 47. Through this line, the applying voltage controlling unit 12 shown in FIG. 1 adjusts the variable sensitivity voltage between the unit-cell electrode 46 and the transparent electrode 47, so that a potential gradient in the photoelectric conversion film 45 is controlled. Thus, ionized from the electron-hole pair, a hole is promptly transferred to the unit-cell electrode 46 and an electron is promptly transferred to the transparent electrode 47, so that the recombination is suppressed, and sensitivity adjustment for the solid-state imaging device 1 is enabled through a control of the potential gradient.

Figure 4:
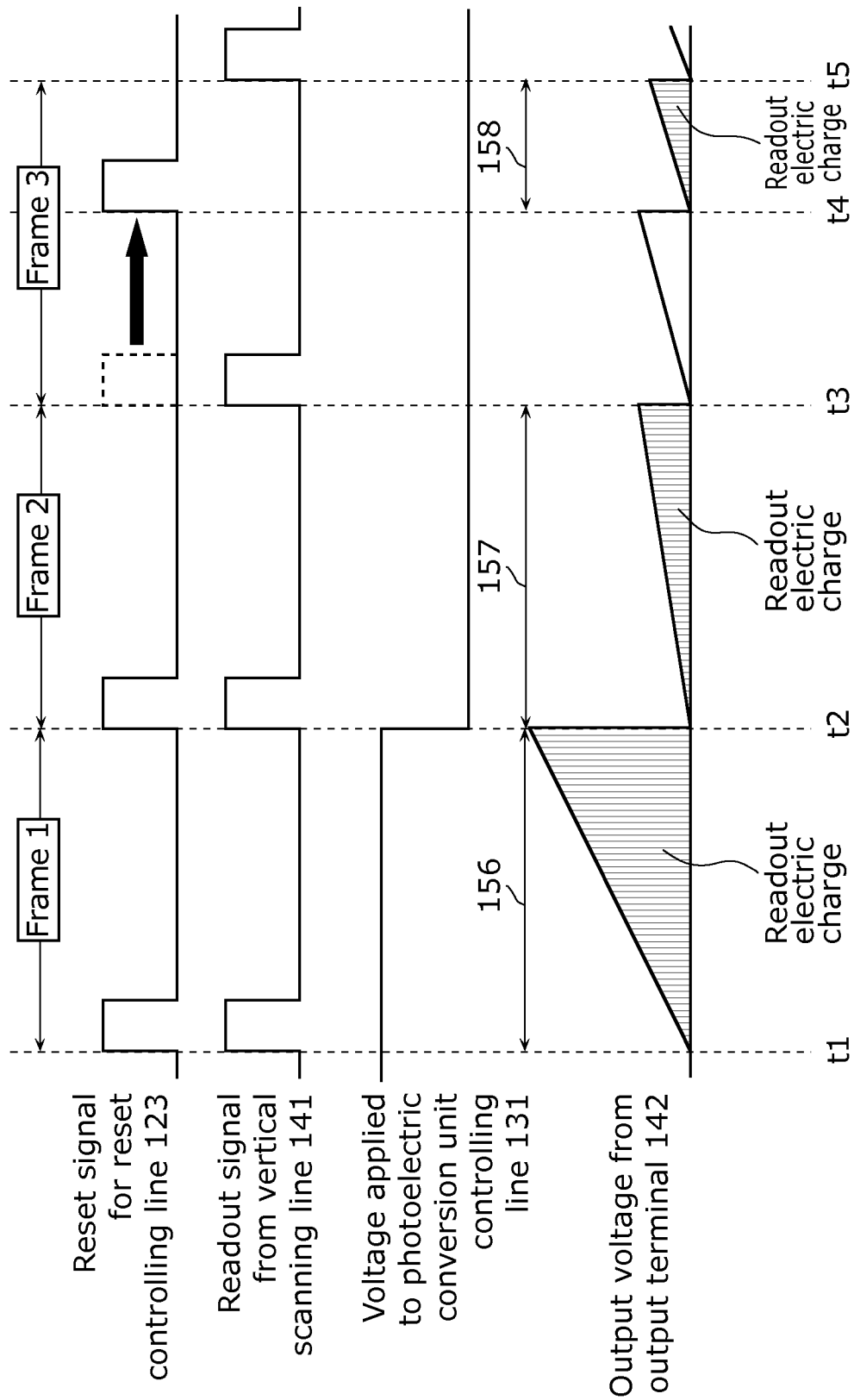
FIG. 4 is a timing chart for showing a driving method in exposure compensation performed in the image-capturing apparatus according to Embodiment 1 of the present disclosure.

The image-capturing apparatus according to this embodiment is capable of performing exposure adjustment (exposure compensation) by using the solid-state imaging device 1 configured as above, and by controlling the electronic shutter driving unit 11 and the applying voltage controlling unit 12 in a coordinated manner using the exposure compensation controlling unit 13. FIG. 4 shows, for example, a driving method in the exposure adjustment performed by the image-capturing apparatus according to this embodiment.

For example, when an accumulation and readout of electric charges in Frame 2 are started following an accumulation and readout of electric charges in Frame 1, the applying voltage controlling unit 12 varies only the variable sensitivity voltage to be applied to the solid-state imaging device 1 at t2 shown in FIG. 4, that is, the variable sensitivity voltage to be applied to the photoelectric conversion unit controlling line 131. As a result, the exposure adjustment can be performed by controlling the amount of electric charges accumulated in the solid-state imaging device 1 without varying the electric charge accumulation time period, that is, while equalizing an electric charge accumulation time period 156 indicated by t1 to t2 in FIG. 4 and an electric charge accumulation time period 157 indicated by t2 to t3 in FIG. 4.

Moreover, in an accumulation and readout of electric charges in Frame 3, the electronic shutter driving unit 11 varies the electronic shutter timing from t3 to t4 in FIG. 4. Thus, the exposure adjustment can be performed by controlling the amount of electric charges accumulated in the solid-state imaging device 1 as a result of varying the electric charge accumulation time period from an electric charge accumulation time period indicated by t3 to t5 to an electric charge accumulation time period 158 indicated by t4 to t5 in FIG. 4.

Figure 5:
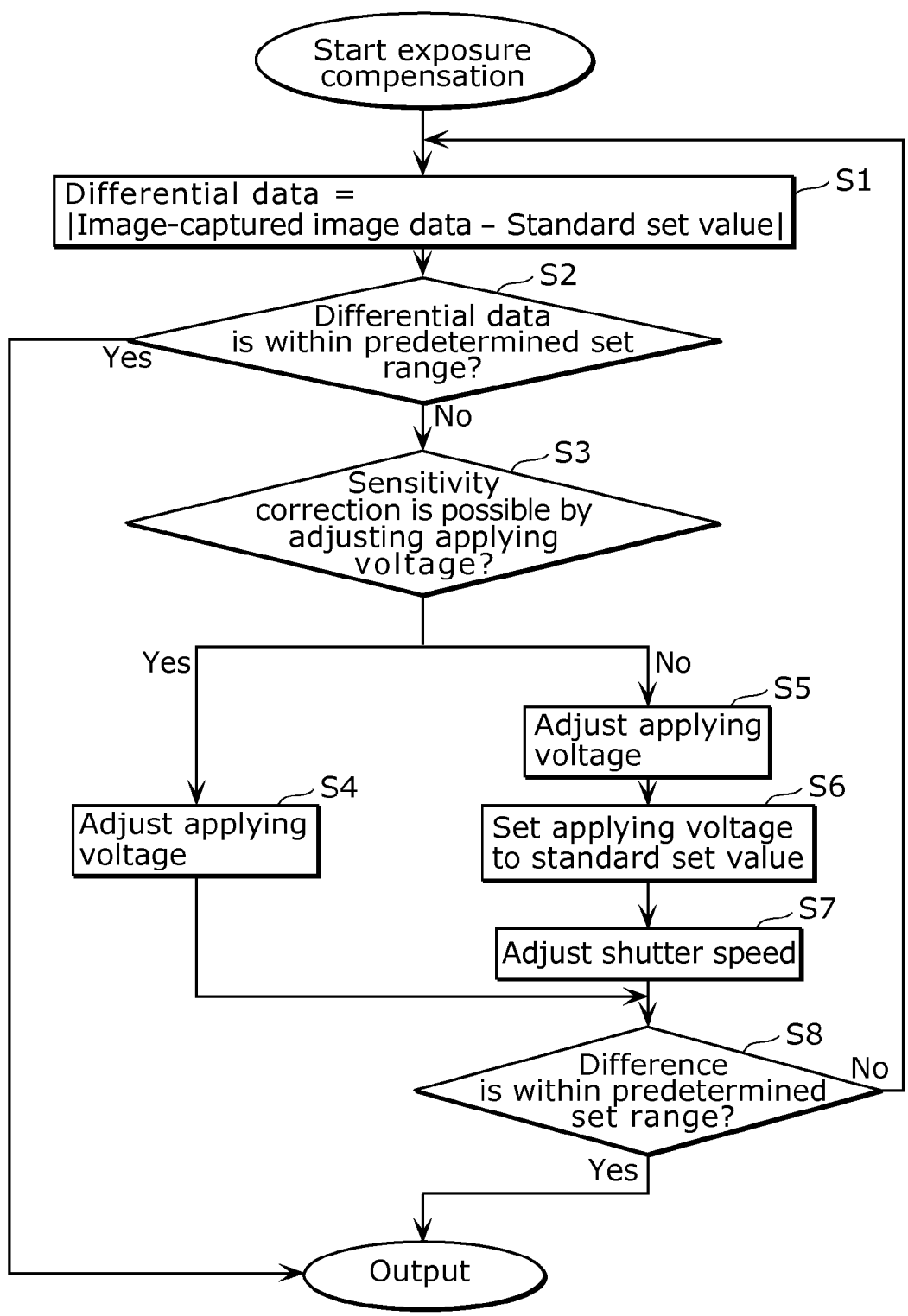
FIG. 5 is a flowchart showing a procedure of the exposure compensation performed in the image-capturing apparatus according to Embodiment 1 of the present disclosure.

FIG. 5 is a flowchart showing a procedure of the exposure compensation performed by the exposure compensation controlling unit 13 using the driving method shown in FIG. 4 performed in the image-capturing apparatus according to this embodiment.

Following the start of the exposure compensation, in Step S1, differential data is calculated which indicates a difference between the output value of the obtained image-captured image data and a desired standard exposure set value. Here, the standard exposure set value can be arbitrary set.

Next, in Step S2, it is determined whether or not the obtained differential data is within a predetermined set range (less than or equal to a set value). When it is determined the obtained differential data is within the predetermined set range (YES in Step S2), the obtained image-captured image data is outputted.

Next, when it is determined the differential data obtained in Step S2 is not within the predetermined set range (NO in Step S2), the process proceeds to Step S3 to determine whether or not the obtained differential data is within a range in which sensitivity correction is possible in the solid-state imaging device 1.

Next, when the obtained differential data is within the range in which sensitivity correction is possible (YES in Step S3), the process proceeds to Step S4 to control, by the applying voltage controlling unit 12, the variable sensitivity voltage to be applied to the photoelectric conversion unit controlling line 131 in the solid-state imaging device 1 such that the output value of the image-captured image data approximates the standard exposure set value (such that the difference decreases).

Next, when the obtained differential data is not within the range in which sensitivity correction is possible (NO in Step S3), the process proceeds to Step S5 to control, by the applying voltage controlling unit 12, the variable sensitivity voltage to be applied to the photoelectric conversion unit controlling line 131 in the solid-state imaging device 1 such that the output value of the image-captured image data approximates the standard exposure set value.

Next, the process proceeds to Step S6 to set the variable sensitivity voltage varied in Step S5 to an applying voltage standard set value. Here, the applying voltage standard set value can be arbitrary set.

Next, the process proceeds to Step S7 to adjust, by the electronic shutter driving unit 11, electronic shutter timing in the solid-state imaging device 1 (timing of the reset transistor 117 entering a conducting state) such that the output value of the image-captured image data approximates the standard exposure set value.

Next, following Step S4 or Step S7, the process proceeds to Step S8 to determine whether or not the difference between the output value of the image-captured image data and the standard exposure set value is within the predetermined set range (less than or equal to the set value). When the difference is within the predetermined set range (YES in Step S8), the image-captured image data is outputted. When the difference is not within the predetermined set range (No in Step S8), the exposure compensation is restarted from the beginning.

It is to be noted that Steps S5, S6, and S7 may be performed in a different order, or may be simultaneously performed. Moreover, Step S6 is not necessary in some cases.

Figure 6A:
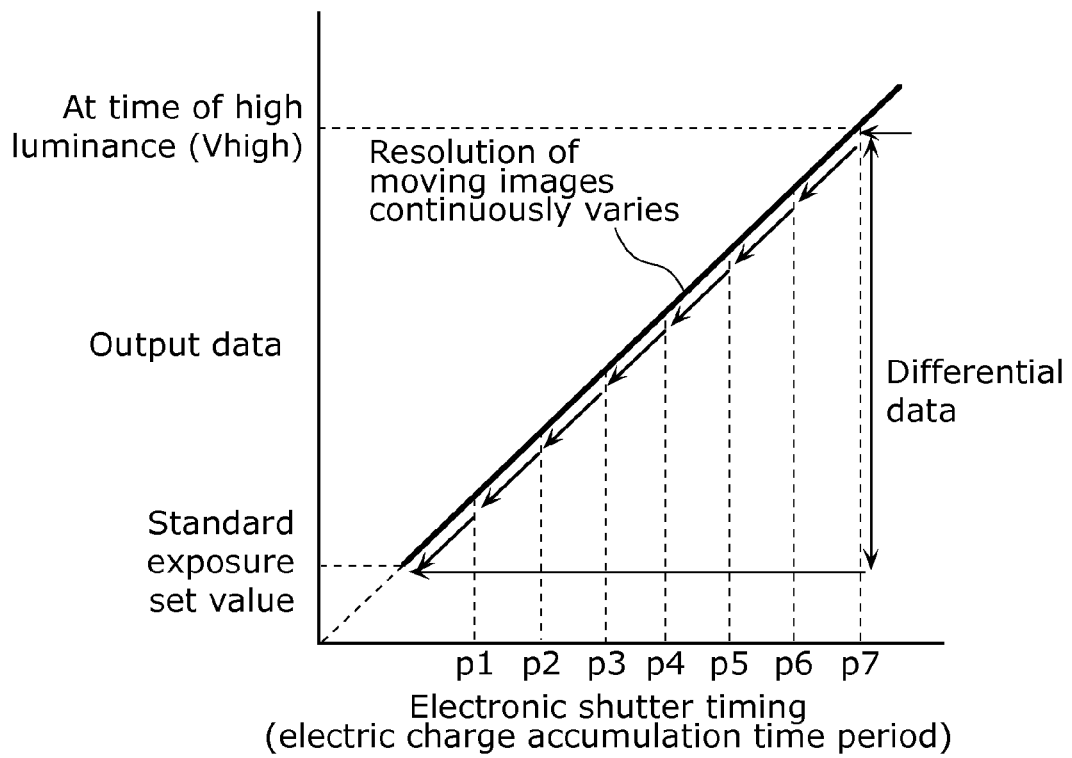
FIG. 6A is a diagram showing an example of a result of exposure compensation performed by an ordinary electronic shutter function.
Figure 6B:
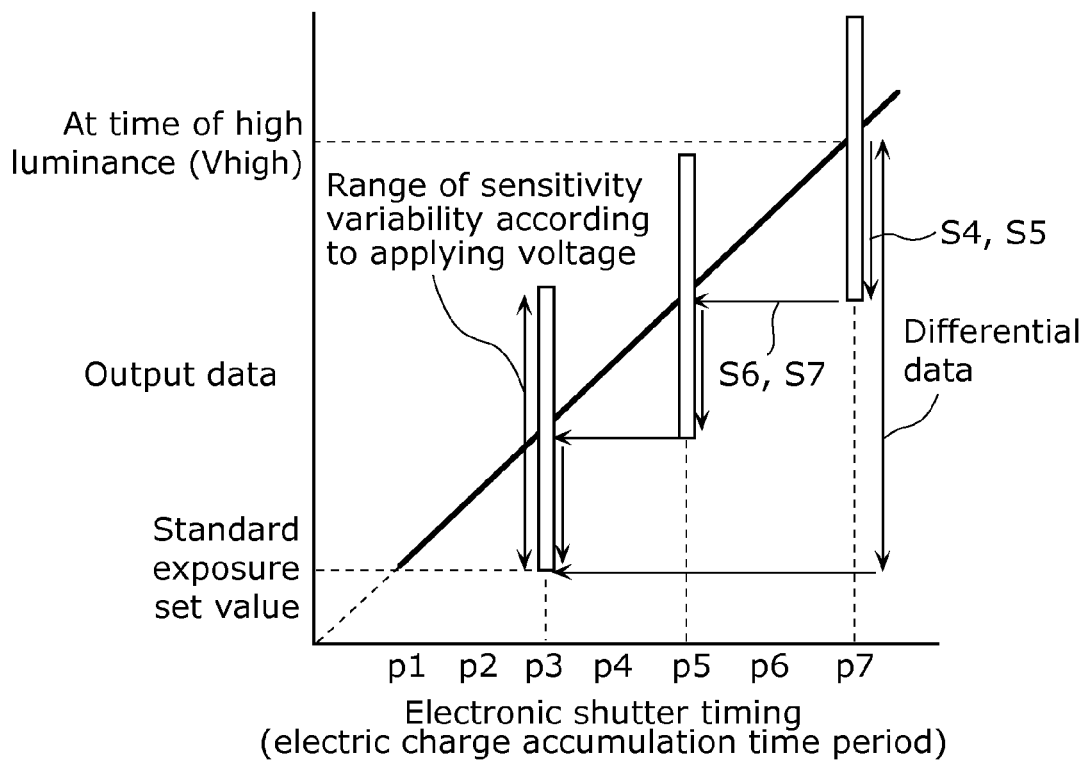
FIG. 6B is a diagram showing an example of a result of the exposure compensation performed in the image-capturing apparatus according to Embodiment 1 of the present disclosure.

FIG. 6A shows an example of the result of exposure compensation performed by an ordinary electronic shutter function and FIG. 6B shows an example of the result of the exposure compensation performed according to the procedure shown in FIG. 5. Here, Steps S4, S5, S6, and S7 in FIG. 5 correspond to Steps S4, S5, S6, and S7 in FIG. 6B, respectively.

When an environment of the subject varies to have higher luminance, in the exposure compensation performed by the ordinary electronic shutter function, the exposure compensation is performed by continuously varying the electronic shutter timing from p7 to p6, p5, p4, p3, p2, and p1 in this order as shown in FIG. 6A for the purpose of approximating the output value of the image-captured image data obtained at the time of high luminance, that is, an output data (Vhigh) to the standard exposure set value. As a result, visually undesirable video may be obtained in which the resolution of moving images varies on a frame basis.

On the other hand, in the exposure compensation shown in FIG. 5, the applying voltage controlling unit 12 performs the exposure compensation by continuously adjusting the sensitivity in Steps S4 and S5. Subsequently, in Steps S6 and S7, an applying voltage is set to the standard set value, and the exposure compensation is performed by adjusting the electronic shutter timing by the electronic shutter driving unit 11. Specifically, the exposure compensation is performed by sequentially varying the electronic shutter timing from p7 to p5, and to p3. However, when the electronic shutter timing are varied from p7 to p5, and from p5 to p3, the electronic shutter timing at p4 and p6 can be skipped because Steps S4 and S5 have already been performed. As a result, it is possible to avoid the continuous variation in the electronic shutter timing. Accordingly, unlike the ordinary exposure compensation, there is not need to continuously vary the electronic shutter timing in the exposure compensation in FIG. 5, thereby significantly suppressing variation in the resolution of moving images.

As described with reference to the accompanying drawings, the image-capturing apparatus according to one exemplary embodiment of the present disclosure includes: the solid-state imaging device 1 which has characteristics in that the sensitivity is varied when a voltage is applied thereto; the electronic shutter driving unit 11 which controls the accumulation time period during which the light electric charges generated in response to light incident on the solid-state imaging device 1 are accumulated; the applying voltage controlling unit 12 which applies the variable sensitivity voltage to the solid-state imaging device 1; the system controlling unit 10 which detects the output level of the solid-state imaging device 1; and the exposure compensation controlling unit 13 which controls the electric charge accumulation time period and the variable sensitivity voltage based on the output of the system controlling unit 10. The exposure compensation controlling unit 13 is for adjusting the voltage to be applied to the solid-state imaging device 1 and operations of the electronic shutter according to the brightness of the subject, and is capable of performing exposure compensation without continuously varying the timing of the electronic shutter by adjusting the sensitivity using the variable sensitivity voltage to be applied to the solid-state imaging device 1.

Moreover, the image-capturing apparatus according to one exemplary embodiment of the present disclosure includes the exposure compensation controlling unit 13 which switches between the first driving mode in which the variable sensitivity voltage is varied according to the output of the system controlling unit 10 while the electric charge accumulation time period is fixed and the second driving mode in which the electric charge accumulation time period and the variable sensitivity voltage are varied according to the output of the system controlling unit 10, so as to control the image signal provided from the solid-state imaging device 1. With this, the exposure compensation which suppresses unnatural variation in frequency of moving images is enabled.

It is to be noted that although the output is lowered from the time of high luminance to approximate the standard exposure set value for the exposure compensation in FIG. 6A and FIG. 6B, for example, the output may be raised from the time of low luminance to approximate the standard exposure set value for the exposure compensation.

Moreover, the structure of the solid-state imaging device 1 according to one exemplary embodiment of the present disclosure is not limited to that shown in FIGS. 2 and 3 as long as it is so-called a sensitivity-variable solid-state imaging device the sensitivity of which is variable.

Figure 7:
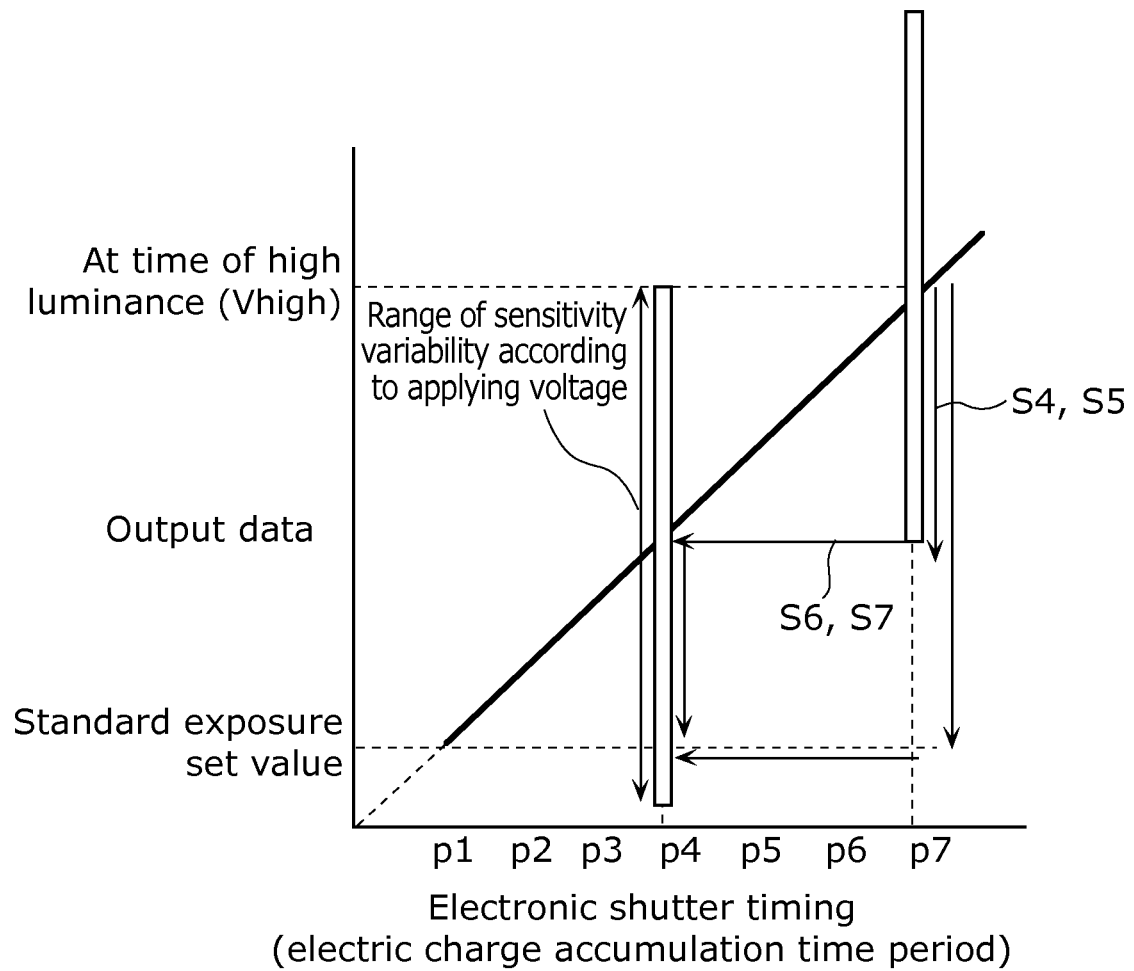
FIG. 7 is a diagram showing an example of a result of the exposure compensation performed in the image-capturing apparatus according to Embodiment 1 of the present disclosure.

For example, although the solid-state imaging device 1 shown in FIGS. 2 and 3 uses a sensitivity-variable device using the photoelectric conversion film 45 made of, for example, amorphous silicon, a photoelectric conversion film 45 may be made of, for example, amorphous selenium to which higher voltage can be applied and which has a wider range of sensitivity variability. Use of such a solid-state imaging device 1 further widens the range of sensitivity variability according to the applying voltage, and as shown in FIG. 7, for example, it is sufficient to only vary the electronic shutter timing from p7 to p4 for approximating the output data (Vhigh) at the time of high luminance to the standard exposure set value, and it is possible to enable exposure compensation further suppressing variation in the frequency of moving images.

Moreover, although a signal readout circuit including three transistors used in a MOS imaging sensor is shown as an example of the unit-cell 151 in the solid-state imaging device 1 in FIGS. 2 and 3, the unit-cell 151 may be a signal readout circuit including four transistors.

Moreover, the solid-state imaging device shown in FIGS. 2 and 3 uses, as a signal readout unit, a signal readout circuit including three transistors or four transistors that are used in a conventional MOS imaging sensor, an electric charge transferring path including a resistor used in the conventional MOS imaging sensor may be used as the signal readout unit. Moreover, although a signal electric charge accumulating unit includes a diode, the signal electric charge accumulating unit may include a capacitor. Moreover, a CCD solid-state imaging device may be used.

Embodiment 2

In an image-capturing apparatus according to Embodiment 2 of the present disclosure, a solid-state imaging device 1 has a configuration different from that of the image-capturing apparatus in Embodiment 1. The following describes details of the solid-state imaging device 1 according to this embodiment with reference to FIG. 8.

Figure 8:
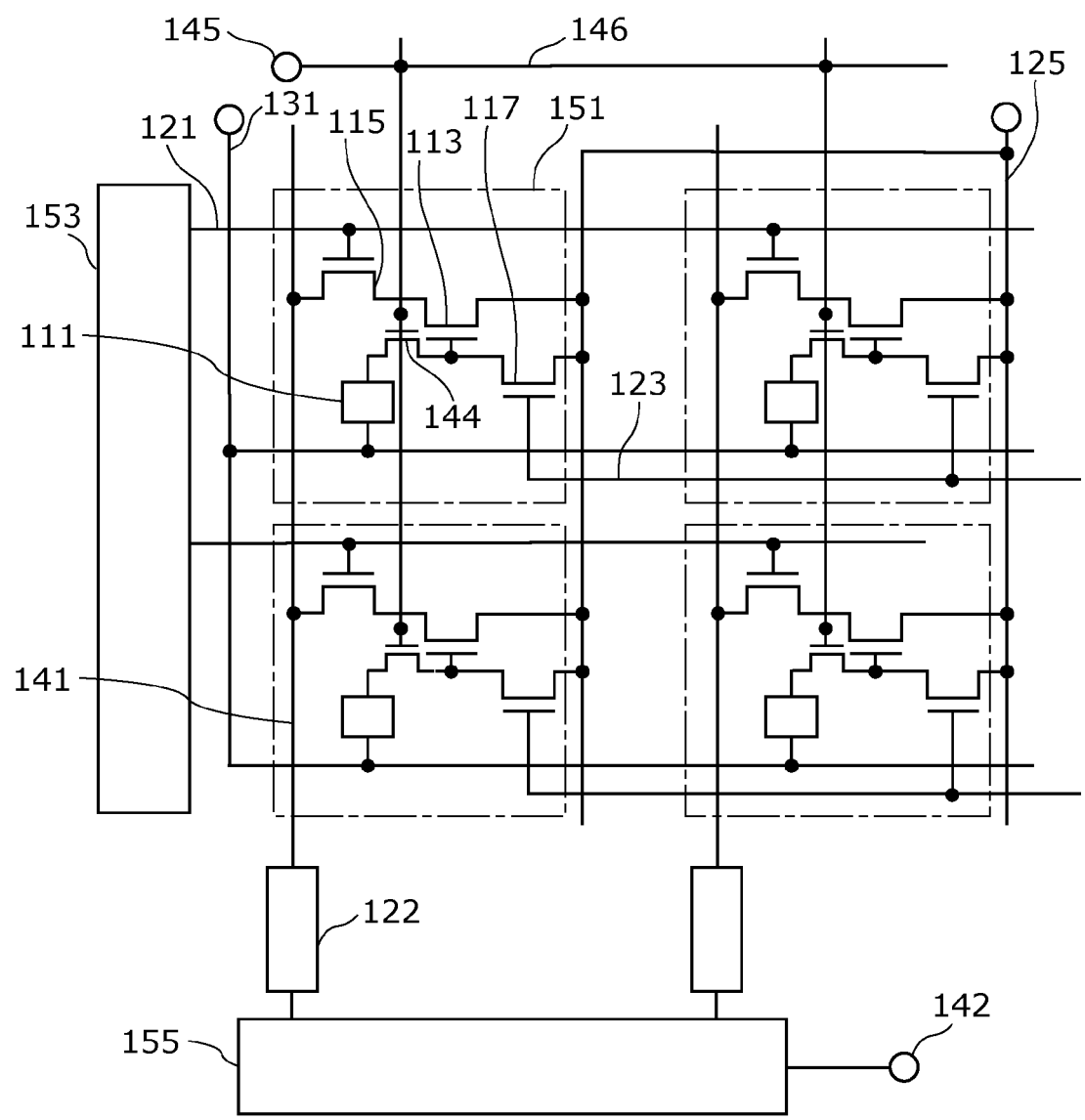
FIG. 8 is a circuit diagram showing a configuration of a solid-state imaging device according to Embodiment 2 of the present disclosure.

FIG. 8 is a circuit diagram showing a configuration of the solid-state imaging device 1 according to this embodiment. It is to be noted that although FIG. 8 shows "two rows by two columns" of the unit-cells 151, the number of rows and columns may be arbitrary set.

The solid-state imaging device 1 according to this embodiment is different from the solid-state imaging device 1 in Embodiment 1 in that, as shown in FIG. 8, the unit-cell 151 further includes a constant bias transistor 144 the gate of which is connected to a constant bias power source 145 via a constant bias control line 146. The constant bias transistor 144 is connected to the photoelectric conversion film 45 (the unit-cell electrode 46), the gate of the amplifier transistor 113, and the drain of the reset transistor 117. The configuration according to Embodiment 1 enables the exposure compensation suppressing the variation in the frequency of moving images, and this configuration enables further suppression of the variation in the frequency of moving images. Reasons for this are described in detail below.

Figure 10:
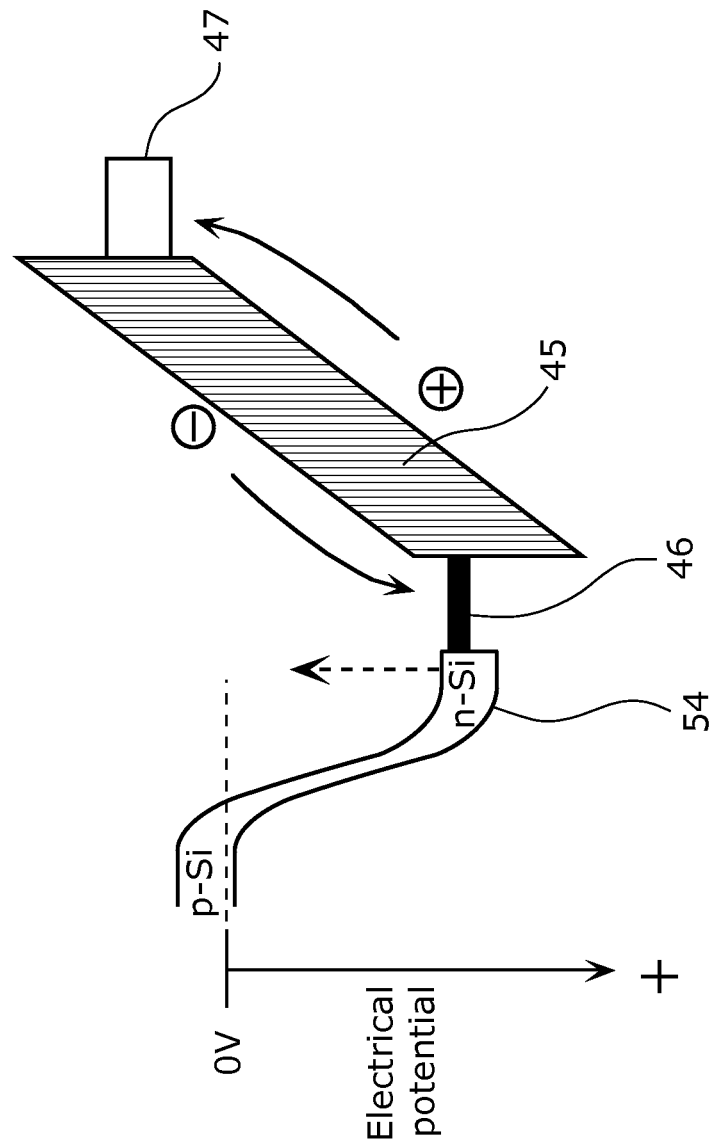
FIG. 10 is a potential diagram of a photoelectric conversion unit in the solid-state imaging device according to Embodiment 1 of the present disclosure.

FIG. 10 is a potential diagram of the photoelectric conversion unit 111 while the solid-state imaging device 1 is driven.

For example, when a carrier is an electron, an electron generated in the photoelectric conversion film 45 is accumulated in the diffusion layer 54 according to the potential gradient generated between the transparent electrode 47 and the unit-cell electrode 46. Accumulation of the electric charges in the diffusion layer 54 decreases the electrical potential of the diffusion layer 54 as shown in FIG. 10 (moved up in FIG. 10), and therefore causes the potential gradient generated between the unit-cell electrode 46 and the transparent electrode 47 to be shallow. As a result, the voltage applied to the photoelectric conversion film 45 is lowered, that is, the voltage applied to the photoelectric conversion film 45 is varied while the solid-state imaging device 1 is driven.

Figure 9:
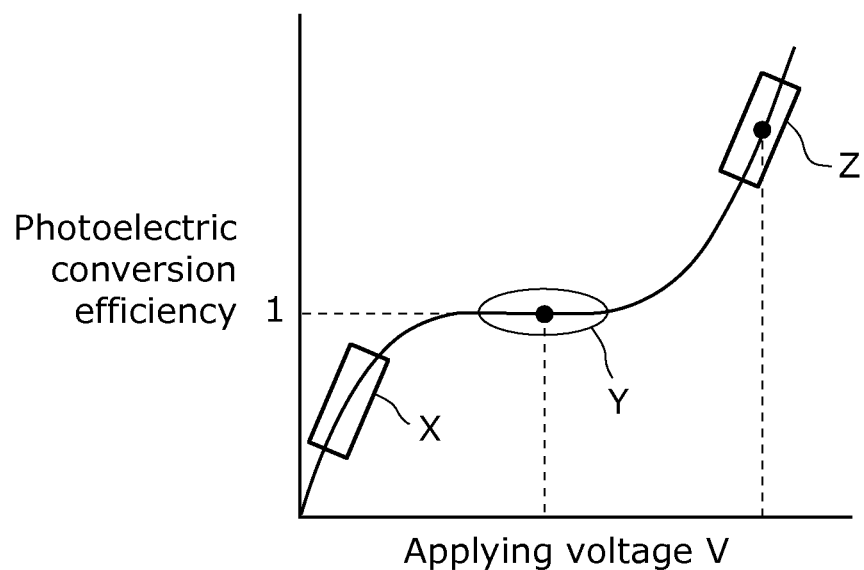
FIG. 9 is a diagram showing an example of photoelectric conversion characteristics of a photoelectric conversion film in the solid-state imaging device according to Embodiment 1 of the present disclosure.

Furthermore, FIG. 9 shows an example of photoelectric conversion characteristics of the photoelectric conversion film 45 in the solid-state imaging device 1 according to Embodiment 1. As shown in FIG. 9, variation in the voltage applied to the photoelectric conversion film 45 causes variation in the photoelectric conversion characteristics; that is, there are a region X and a region Z in which photoelectric conversion efficiency is varied when the voltage applied to the photoelectric conversion film 45 is varied while the solid-state imaging device 1 is driven. Therefore, when driving the solid-state imaging device 1 using not only a region Y but the region X and the region Z, there is a need to maintain the voltage applied to the photoelectric conversion film 45 constant, that is, to maintain the photoelectric conversion characteristics constant.

In this regard, inclusion of the constant bias transistor 144 in the unit-cell 151 enables suppression of variation in photoelectric conversion efficiency while the solid-state imaging device 1 is driven. Application of a constant bias from the constant bias power source 145 to the constant bias transistor 144 via the constant bias control line 146 maintains the electrical potential of an accumulating unit (diffusion layer 54) constant, so that it is possible to maintain the electrical potential of the unit-cell electrode 46 constant even when signals are accumulated. As a result, the voltage applied to the photoelectric conversion film 45 can be maintained constant. Accordingly, it is possible to widen the range of variability according to the variable sensitivity voltage applied to the solid-state imaging device 1, and thus exposure compensation is possible further suppressing variation in the frequency of moving images than the above Embodiment 1.

It is to be noted that, in the solid-state imaging device 1 according to this embodiment, the constant bias control line 146 is not limited to the configuration shown in FIG. 8 as long as it connects the constant bias power source 145 and the gate of the constant bias transistor 144.

Embodiment 3

Figure 11:
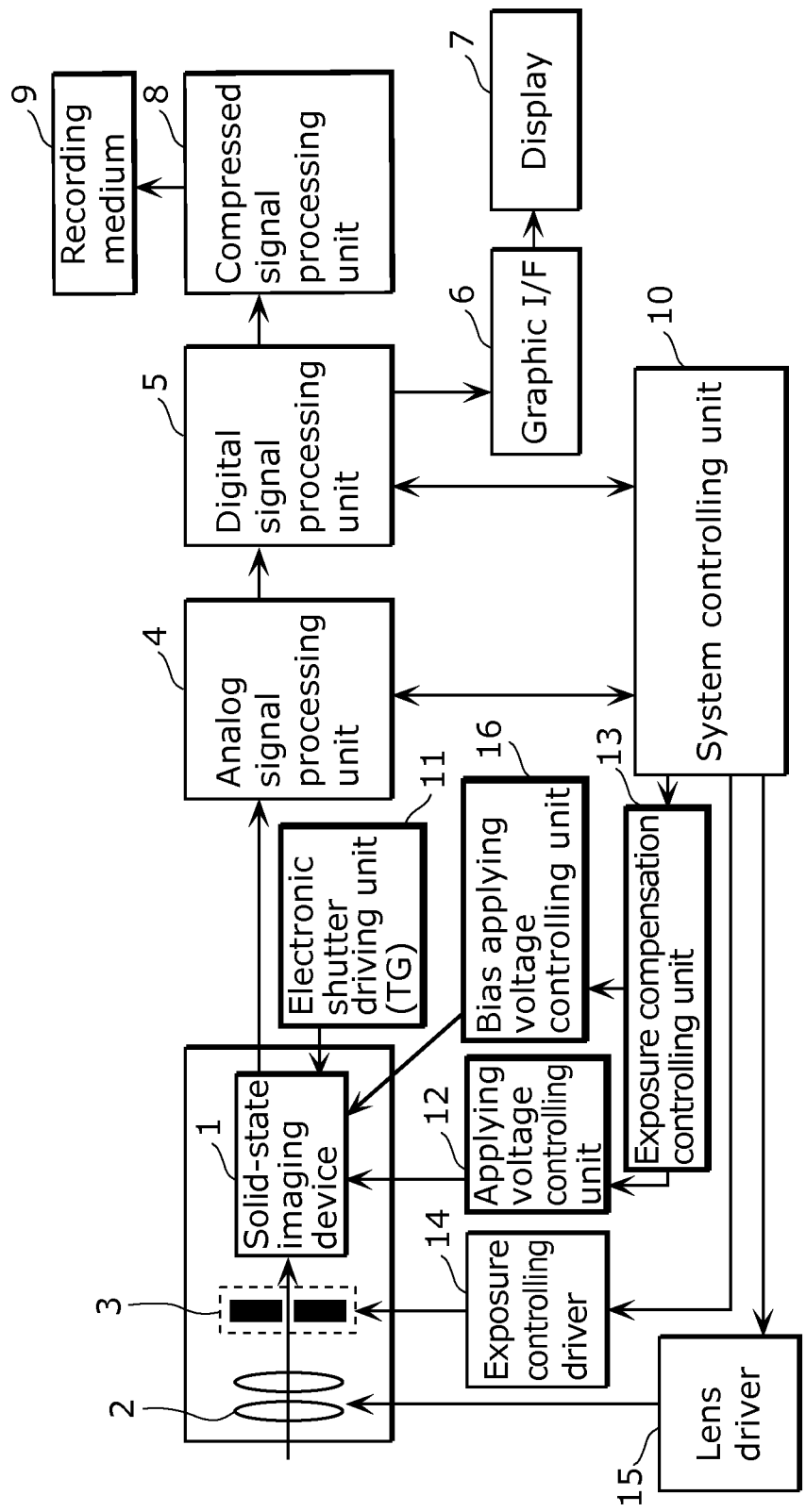
FIG. 11 is a function block diagram showing a configuration of an image-capturing apparatus according to Embodiment 3 of the present disclosure.

FIG. 11 is a function block diagram showing a configuration of an image-capturing apparatus (camcorder) according to Embodiment 3 of the present disclosure.

The image-capturing apparatus according to this embodiment is different from the image-capturing apparatus in Embodiment 2 in further including a bias applying voltage controlling unit 16 which varies a voltage of the constant bias power source 145 according to an output of the system controlling unit 10. The exposure compensation controlling unit 13 varies the voltage of the constant bias power source 145 by controlling the bias applying voltage controlling unit 16 based on the output level detected in the system controlling unit 10. Although the configuration in Embodiment 2 enables the exposure compensation suppressing the variation in the frequency of moving images, this configuration enables exposure compensation further suppressing the variation in the frequency of moving images.

The image-capturing apparatus according to this embodiment is capable of controlling the voltage applied to the photoelectric conversion film 45 because the voltage supplied from the constant bias power source 145 connected to the constant bias transistor 144 is variable. Use of the bias applying voltage controlling unit 16 together with the applying voltage controlling unit 12 further widens the range of the variable sensitivity voltage applied to the photoelectric conversion film 45, which enables exposure compensation still further suppressing the variation in the frequency of moving images.

Comparative Example

Figure 12:
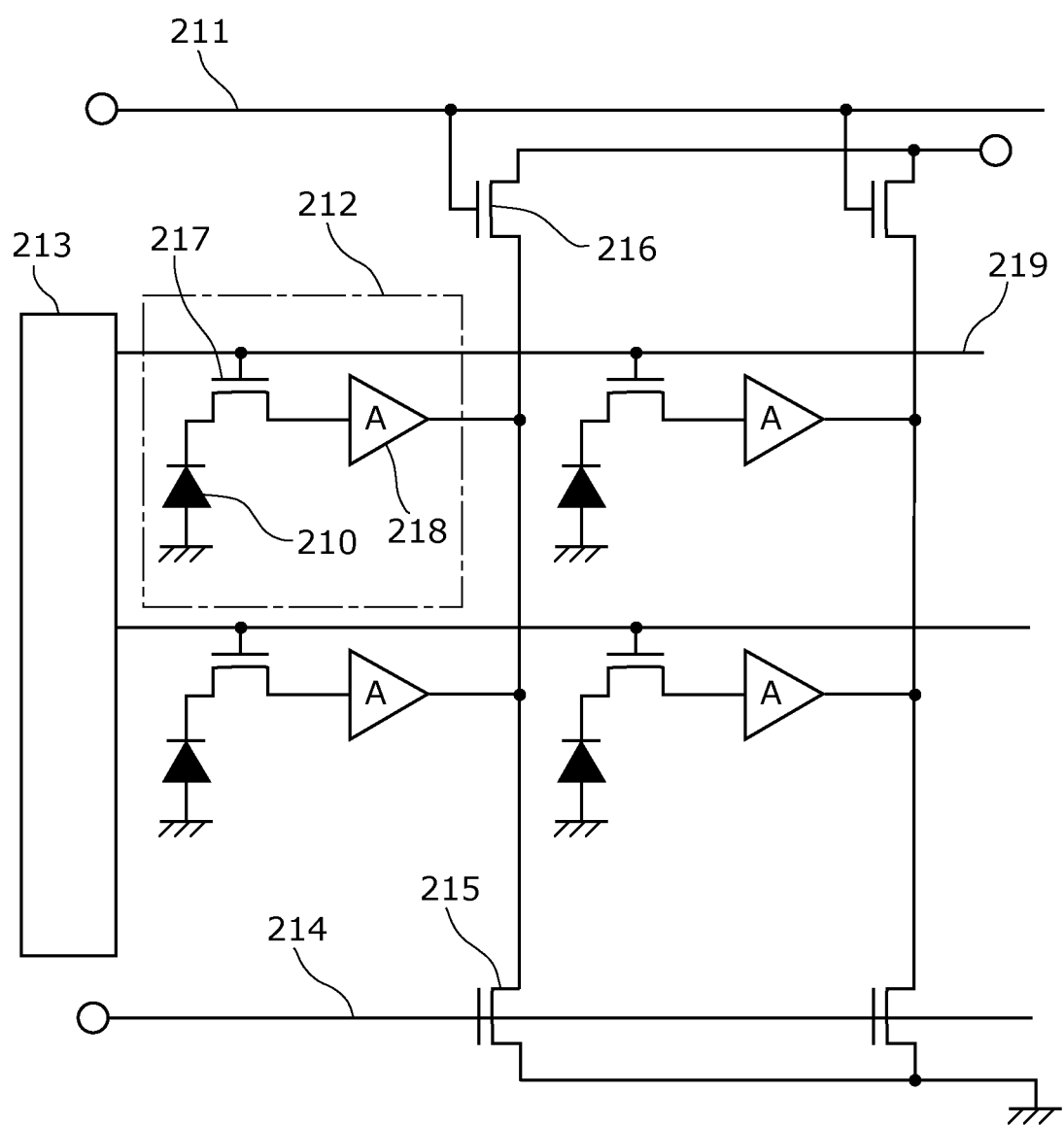
FIG. 12 is a circuit diagram showing a configuration of a solid-state imaging device according to a comparative example of embodiments of the present disclosure.
Figure 13:
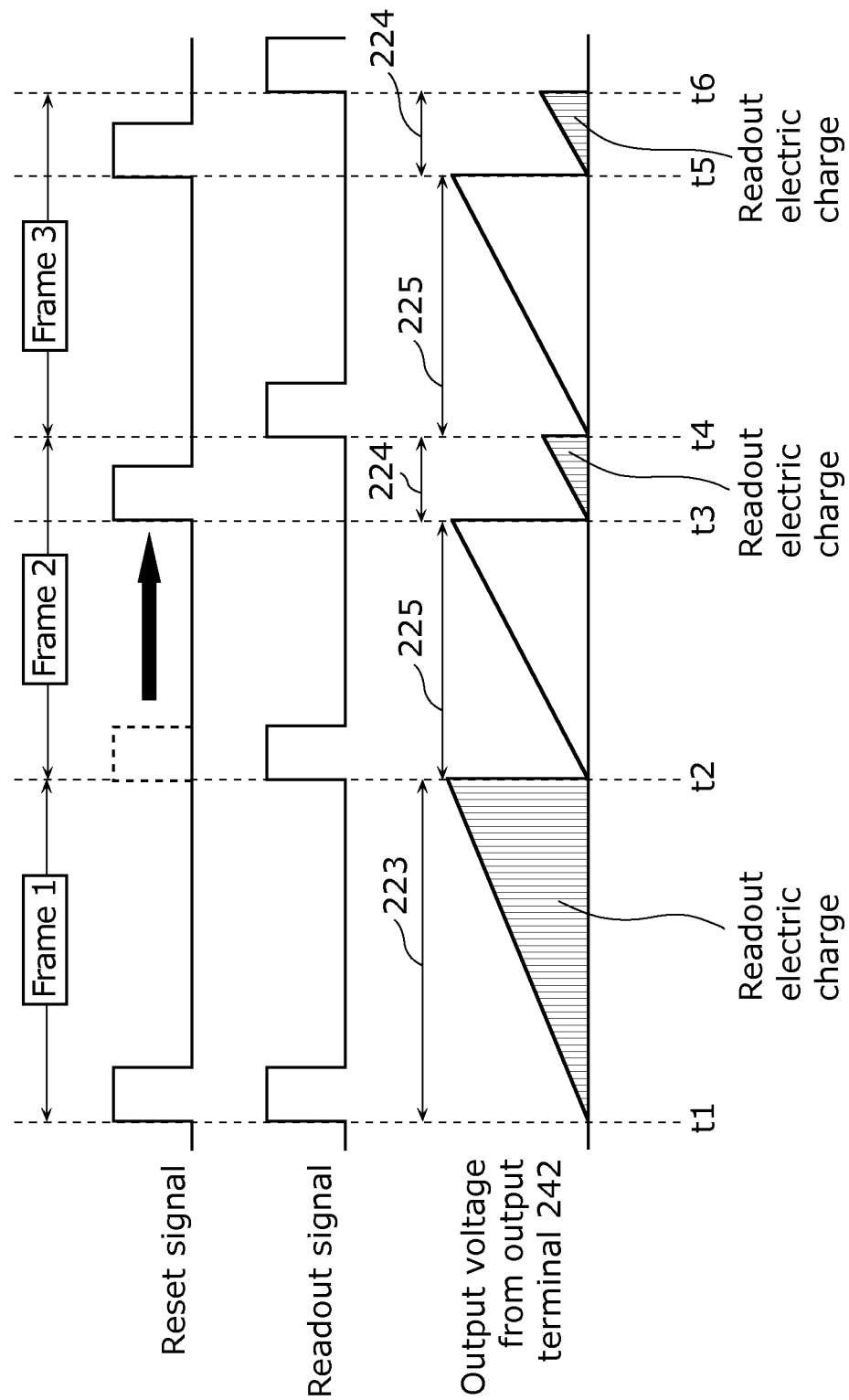
FIG. 13 is a timing chart showing a driving method for operations of an electronic shutter in an image-capturing apparatus according to the comparative example of the embodiments of the present disclosure.

The following describes an image-capturing apparatus according to a comparative example of the embodiments of the present disclosure with reference to FIGS. 12 and 13.

FIG. 12 is a circuit configuration diagram of a solid-state imaging device included in the image-capturing apparatus according to this comparative example.

In this solid-state imaging device, a signal photoelectric-converted in the photoelectric conversion unit 210 is provided to an output amplifier 218 through a selection transistor 217 in the unit-cell 212 selected by a vertical scanning unit 213. The signal amplified in the output amplifier 218 is outputted through a readout transistor 216 which is controlled by a readout signal supplied via a readout controlling line 211. Moreover, the signal amplified in the output amplifier 218 is reset by a reset transistor 215 which is controlled by a reset signal supplied via a reset controlling line 214 according to the necessity. By adjusting the readout signal and the reset signal, the exposure adjustment is performed through the above operation of the electronic shutter. It is to be noted that the selection transistor 217 is controlled by a selection signal supplied via a vertical controlling line 219.

FIG. 13 is a timing chart showing a driving method for operations of an electronic shutter in the image-capturing apparatus according to this comparative example.

In the image-capturing apparatus according to this comparative example, as shown in FIG. 13, it is possible to control an electric charge accumulation time period 223 by shifting phases of the readout signal and the reset signal provided to the unit-cell 212.

However, in the image-capturing apparatus according to this comparative example, when pulse timing of the reset signal is varied from t2 to t3 for exposure adjustment as performed in Frame 2, an electric charge accumulation time period 224 (time period from t3 to t4 in FIG. 13) in a time period of Frame 2 is shortened relative to the electric charge accumulation time period 223 (time period from t1 to t2 in FIG. 13) in a time period of Frame 1 (t3 to t4 is shorter than t1 to t2). As a result, the electric charges that are generated in the photoelectric conversion unit 210, passes through the selection transistor 217, amplified in the output amplifier 218, and accumulated in an unnecessary electric charge accumulation time period 225 that is indicated by t2 to t3 in FIG. 13 are not outputted as video via the readout transistor 216, but reset through the reset transistor 215. As a result, when a subject is moving at the time of video capturing, the captured images of the subject are discontinuously outputted as video. Thus, use of the conventional electronic shutter function in exposure compensation causes, especially when continuously varying exposure time, deterioration in video quality is caused in which the frequency of moving images unnaturally varies on a frame basis because the difference in the frequency of moving images in each exposure time directly appears on a screen.

Although the image-capturing apparatus according to the present disclosure has been described based on some exemplary embodiments, the present disclosure is not limited to these embodiments. Various modifications to the embodiments that are conceived by the person skilled in the art and other embodiments obtainable by combining the structural elements in the embodiments without materially departing from the scope of the present disclosure are included within the scope of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is applicable to an image-capturing apparatus, and particularly to an image-capturing apparatus such as a broadcasting camcorder, and a video apparatus for capturing video with high resolution.

The invention claimed is:

1. An image-capturing apparatus comprising
a solid-state imaging device including a plurality of unit-cells arranged in a matrix,
wherein each of the unit-cells includes a photoelectric conversion unit,
the photoelectric conversion unit includes:
a photoelectric conversion film formed above a semiconductor substrate;
a pixel electrode formed on a surface of the photoelectric conversion film, the surface facing the semiconductor substrate; and
a transparent electrode formed on a surface of the photoelectric conversion film, the surface being opposite the surface on which the pixel electrode is formed, and
the image-capturing apparatus further comprises:
a voltage applying unit configured to apply, between the pixel electrode and the transparent electrode, a variable sensitivity voltage for controlling sensitivity of the solid-state imaging device;
a level detecting unit configured to detect an output level of image-captured image data from the solid-state imaging device; and
a controlling unit configured to vary the variable sensitivity voltage based on the output level detected by the level detecting unit.

2. The image-capturing apparatus according to claim 1,
wherein the solid-state imaging device further includes vertical signal lines each of which is provided corresponding to a column of the unit-cells and transmits signal voltages of the unit-cells in the corresponding column,
each of the unit-cells further includes an amplifier transistor, a selection transistor, and a reset transistor,
the amplifier transistor is connected between a corresponding one of the vertical signal lines and a power line, and has a gate connected to the pixel electrode,
the reset transistor is connected to the pixel electrode, and resets electrical potential of the pixel electrode, and
the selection transistor is connected between the amplifier transistor and the vertical signal line, or between the amplifier transistor and the power line.

3. The image-capturing apparatus according to claim 2,
wherein the unit-cell further includes a constant bias transistor, and
the constant bias transistor is connected to the pixel electrode and the gate of the amplifier transistor, and has a gate connected to a constant bias power source.

4. The image-capturing apparatus according to claim 3,
wherein the controlling unit is further configured to vary a voltage of the constant bias power source based on the output level detected by the level detecting unit.

5. The image-capturing apparatus according to claim 1,
further comprising
an electronic shutter controlling unit configured to control an operation of an electronic shutter in the solid-state imaging device,
wherein the controlling unit is further configured to:
vary an accumulation time period during which electric charges are accumulated, by varying timing of the electronic shutter based on the output level detected by the level detecting unit, the electric charges generated in the photoelectric conversion film in response to light incident on the solid-state imaging device; and
determine whether to operate under a first driving mode or a second driving mode based on the output level detected by the level detecting unit, the first driving mode being a mode in which the variable sensitivity voltage is varied while the accumulation time period is fixed, the second driving mode being a mode in which the accumulation time period and the variable sensitivity voltage are varied.

6. The image-capturing apparatus according to claim 1,
further comprising
an electronic shutter controlling unit configured to control an operation of an electronic shutter in the solid-state imaging device,
wherein the controlling unit is further configured to vary an accumulation time period during which electric charges are accumulated, by varying timing of the electronic shutter based on the output level detected by the level detecting unit, the electric charges generated in the photoelectric conversion film in response to light incident on the solid-state imaging device.

* * * * *